United States Patent
Xu

(10) Patent No.: US 9,431,972 B1
(45) Date of Patent: Aug. 30, 2016

(54) APPARATUS AND METHODS FOR DIGITAL PREDISTORTION

(71) Applicant: ALTERA CORPORATION, San Jose, CA (US)

(72) Inventor: Lei Xu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 71 days.

(21) Appl. No.: 14/324,523

(22) Filed: Jul. 7, 2014

(51) Int. Cl.
*H03F 1/26* (2006.01)
*H03F 1/32* (2006.01)

(52) U.S. Cl.
CPC .............. *H03F 1/3258* (2013.01); *H03F 1/26* (2013.01); *H03F 1/3241* (2013.01); *H03F 2201/3227* (2013.01); *H03F 2201/3233* (2013.01)

(58) Field of Classification Search
CPC .. H03F 1/3247; H03F 1/3241; H03F 1/3229; H03F 2201/3233; H03F 1/3276; H03F 3/24; H03F 1/3258; H03F 1/26; H03F 1/3294; H03F 2201/3224; H03F 2200/336; H03F 3/68; H03F 3/245; H03F 3/19; H03F 1/0222; H03F 2200/451; H03F 3/195
USPC ........................................ 330/149; 455/114.3
See application file for complete search history.

(56) References Cited

U.S. PATENT DOCUMENTS

| | | | | |
|---|---|---|---|---|
| 7,924,942 B2 * | 4/2011 | Rexberg | ................ | H03F 1/3247 375/296 |
| 8,283,977 B2 * | 10/2012 | Brown | ....................... | H03F 1/26 330/149 |
| 8,655,289 B2 * | 2/2014 | Fudaba | .................. | H03F 1/3247 330/149 |
| 8,687,733 B1 | 4/2014 | Gheitanchi et al. | | |
| 8,787,487 B2 * | 7/2014 | Nagatani | .............. | H04B 1/0475 370/468 |

OTHER PUBLICATIONS

T. Du et al. "A new Accurate Volterra-Based Mode for Behavioral Modeling and Digital Predistortion of RF Power Amplifiers", 2012, pp. 205-218, Progress in Electromagnetic Research C, vol. 29.

* cited by examiner

*Primary Examiner* — Khanh V Nguyen
(74) *Attorney, Agent, or Firm* — Okamoto & Benedicto LLP

(57) ABSTRACT

The present disclosure provides advantageously flexible and effective methods, circuits and systems for digital predistortion. In one embodiment, a predistortion component circuit includes multiple configurable delay line pairs and corresponding configurable look-up tables. Each configurable delay line pair includes a first delay line for delaying an input data signal to provide a delayed input and a second delay line for delaying an input magnitude signal to provide a delayed input magnitude. Each configurable look-up table receives the delayed input magnitude from, and outputs a look-up value for, an associated delay line pair of the plurality of configurable delay line pairs. Other embodiments, aspects and features are also disclosed herein.

12 Claims, 8 Drawing Sheets

$$Z(n) = \sum_{m=0}^{Q}\sum_{p=0}^{Q}\sum_{k=0}^{K} \beta_{m,p,k} \cdot X_{n-m} \cdot |X_{n-p}|^k \quad \text{Eq. (1)}$$

$$= \sum_{m=0}^{Q} X_{n-m} \cdot \sum_{p=0}^{Q}\sum_{k=0}^{K} \beta_{m,p,k} \cdot |X_{n-p}|^k \quad \text{Eq. (2)}$$

$$= \sum_{m=0}^{Q} X_{n-m} \cdot C(|X_{n-p}|, Q, K) \quad \text{Eq. (3)}$$

FIG. 3

APPARATUS AND METHODS FOR DIGITAL PREDISTORTION

BACKGROUND

1. Technical Field

The present invention relates generally to data communications.

2. Description of the Background Art

Power amplifiers are typically used to amplify signals for wireless transmission. For example, remote radio heads (RRHs) use power amplifiers to amplify analog signals which are transmitted over the air to implement 2G, 3G, 4G, and other wireless networks.

Signal distortion caused by the power amplifier's nonlinearity is often compensated by using a predistortion technique. Predistortion involves distorting initial signals before supplying them to the amplifier such that the distortion of the power amplifier will null the predistortion, where the predistortion may be approximately an inverse of the distortion of the power amplifier. In this manner, amplified signals can be generated with signal characteristics linear to the original signal. The predistortion is typically performed in the digital domain just before the digital-to-analog conversion that is used to generate the analog signals which are supplied to the power amplifier for amplification.

SUMMARY

The present disclosure introduces a new digital predistortion (DPD) architecture that avoids the separate treatment of the crossing and non-crossing terms in the DPD forward path. This new architecture does not require additional resource overhead and yet it substantially improves the flexibility of the DPD forward path to adapt to different power amplifiers and meet their various requirements.

In one embodiment, a predistortion component circuit includes multiple configurable delay line pairs and corresponding configurable look-up tables. Each configurable delay line pair includes a first delay line for delaying an input data signal to provide a delayed input and a second delay line for delaying an input magnitude signal to provide a delayed input magnitude. Each configurable look-up table receives the delayed input magnitude from, and outputs a look-up value for, an associated delay line pair of the plurality of configurable delay line pairs.

Another embodiment relates to a method for configuring a predistortion component in a digital predistortion system. This method involves electronically programming a plurality of delay line pairs and a plurality of associated look-up tables.

Another embodiment relates to a system for digital predistortion. The system includes, among other circuits, a predistortion component circuit for receiving an input data signal and outputting a predistorted input data signal, and an adaption component circuit for receiving the at least one data sample and generating coefficients for use by the predistortion component circuit. The predistortion component circuit includes a plurality of configurable delay line pairs and a plurality of configurable look-up tables. Each said configurable delay line pair includes a first delay line for delaying an input data signal to provide a delayed input and a second delay line for delaying an input magnitude signal to provide a delayed input magnitude.

Other embodiments, aspects and features are also disclosed herein.

BRIEF DESCRIPTION OF THE DRAWINGS

FIG. 3 depicts a rewritten Volterra Series model in accordance with an embodiment of the invention.

DETAILED DESCRIPTION

The present disclosure provides advantageously flexible and effective methods, circuits and systems for digital predistortion. In an exemplary use, the predistortion may be applied to compensate for power amplifier non-linearity.

In order to achieve a desirable system performance, power amplifiers in wireless systems often require use of digital predistortion (DPD) algorithms and configurations. However, the operating characteristics of power amplifiers differ substantially in terms of non-linearity, so that substantial flexibility in the DPD technique is desirable in order to enable the DPD circuitry to re-target for various power amplifiers without significant re-engineering efforts.

Conventional DPD circuitry typically treats the so-called crossing terms and non-crossing terms differently in the DPD forward path and also uses a fixed configuration. Applicant has determined the fact that this different treatment of crossing terms and non-crossing terms substantially limits the conventional DPD circuitry's flexibility to meet different power amplifier requirements.

The present disclosure introduces a new DPD architecture that avoids the separate treatment of the crossing and non-crossing terms in the DPD forward path. This new architecture does not require additional resource overhead and yet it substantially improves the flexibility of the DPD forward path to adapt to different power amplifiers and meet their differing requirements. In addition, the new architecture provides improved design flow with recompilation of design if it is implemented in programmable logic (such as FPGA soft logic, for example).

Figure 1:
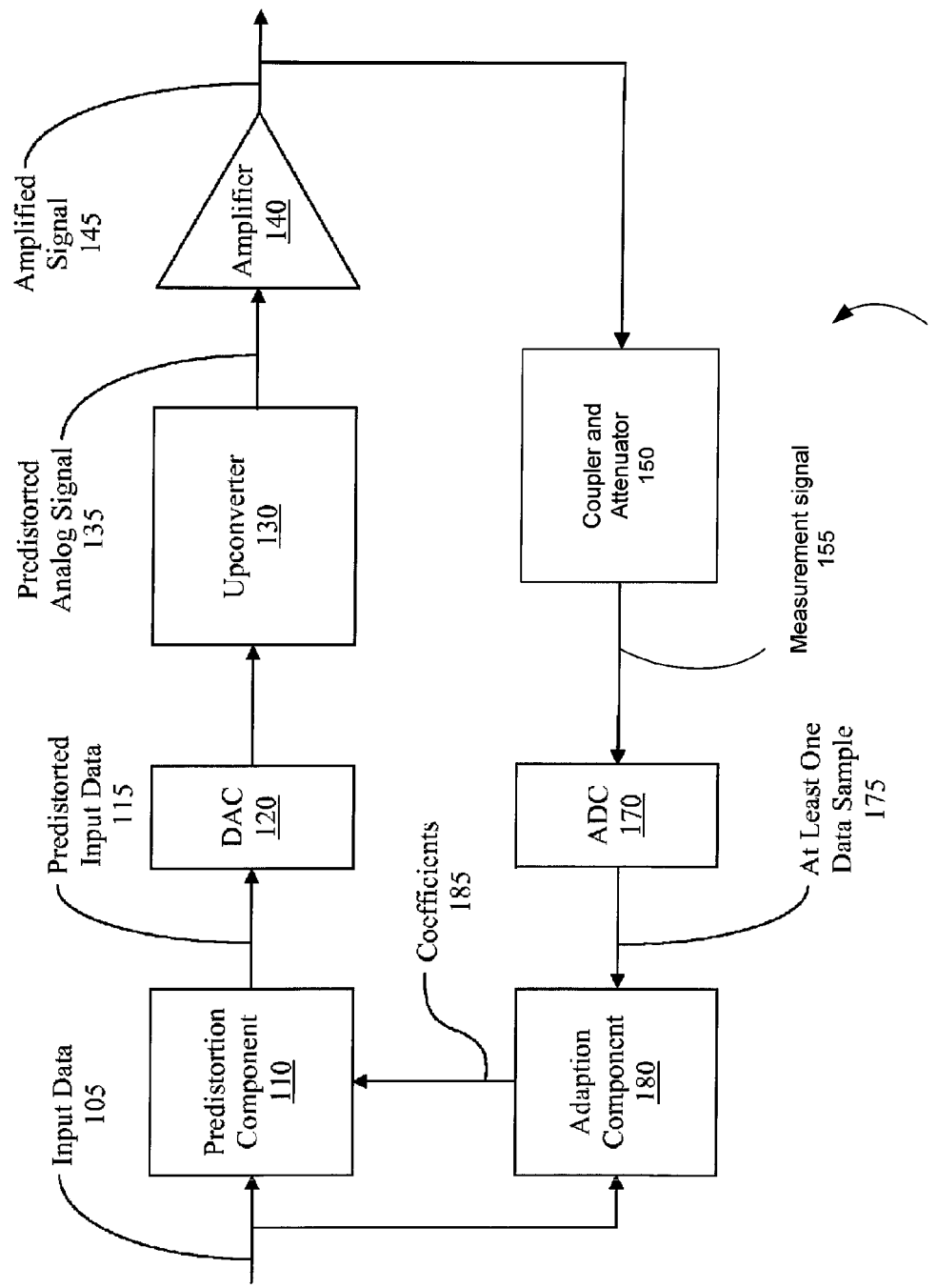
FIG. 1 depicts an exemplary system for performing digital predistortion in accordance with an embodiment of the invention.

FIG. 1 shows an exemplary system 100 for performing digital predistortion in accordance with an embodiment of the invention. As shown in FIG. 1, input data 105 may be received and distorted by a predistortion component 110 to generate predistorted input data 115. The predistorted input data 115 is converted to a predistorted analog signal 135 by a digital-to-analog converter (DAC) circuit 120 and an optional upconverter circuit 130. The predistorted analog signal 135 is the input signal that is supplied to the amplifier 140. The amplifier 140 outputs an amplified signal 145. The amplifier 140 may be a power amplifier that may be used to amplify signals for wireless transmission, for example.

The aim is for the distortion caused by the amplifier 140 to be approximately nullified (canceled out) by the predistortion introduced by the predistortion component 110. The term "predistortion" may be used herein to mean distortion of data or a signal before access by another component (e.g., amplifier 140). In this manner, digital predistortion of data may be performed (e.g., by predistortion component 110) to compensate approximately for distortion of an amplifier (e.g., amplifier 140). In one embodiment, while the amplification may be performed in the analog domain, the predistortion may be performed in the digital domain.

The predistortion applied by the predistortion component 110 may be based on coefficients 185 supplied by the adaption component 180. The coefficients 185 may be generated by the adaption component 180 based on the input data 105 and on data samples of the amplified signal 175. The adaption component 180 may be implemented, for example, using the exemplary structure described below in relation to FIG. 4. Other structures may also be used for the adaption component 180.

A measurement of the analog signal 145 may be performed by coupler and attenuator circuitry 150, and the analog measurement signal 155 output from the coupler and attenuator circuitry 150 may be converted to digital signals using the analog-to-digital converter (ADC) 170. The ADC 170 outputs the digital signals (at least one data sample 175) to the adaptation component 180 for use in generating the coefficients 185.

Figure 2:
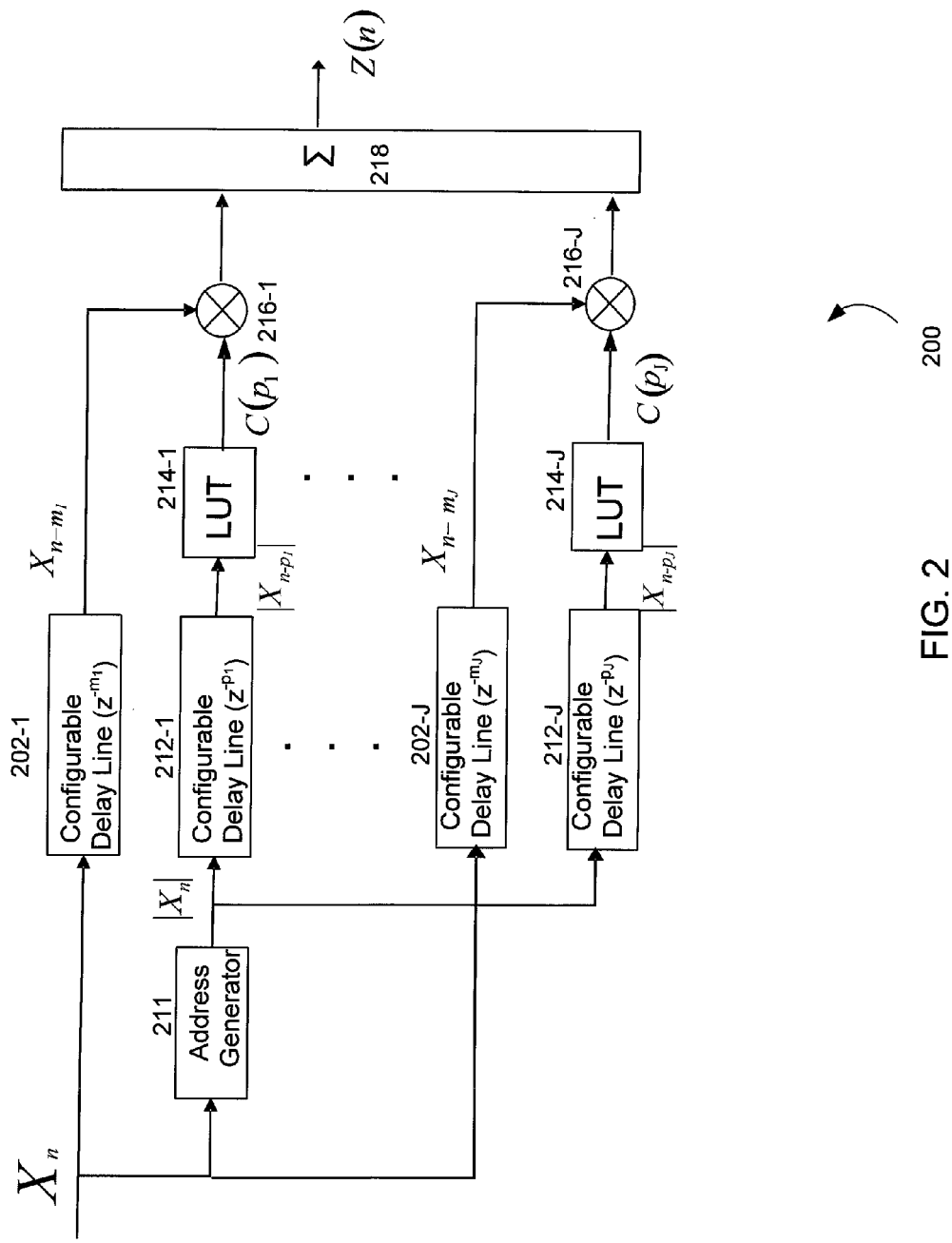
FIG. 2 depicts an exemplary structure for a predistortion component in accordance with an embodiment of the invention.

FIG. 2 shows an exemplary structure for a predistortion component 200 in accordance with an embodiment of the invention. The predistortion component 200 of FIG. 2 may be used, for example, as the predistortion component 110 in the system 100 of FIG. 1.

The input data signal $X_n$ is received by a first plurality of J configurable delay lines 202-1 through 202-J. Each configurable delay line ($z^{-m_j}$) 202-$j$ (j=1 to J) in this first plurality may be electronically programmed to provide a delay of $m_j$ unit intervals. As depicted, the first configurable delay line 202-1 may be electronically programmed to provide a delay of $m_1$ unit intervals so as to output $X_{n-m_1}$, . . . , and the Jth configurable delay line 202-J may be electronically programmed to provide a delay of $m_J$ unit intervals so as to output $X_{n-m_J}$.

The input data signal $X_n$ is also received by the address generator circuit 211. The address generator circuit 211 may effectively square the individual components of $X_n$ and then take the square root of the sum of the squares to generate the output signal $|X_n|$, which is the input magnitude signal.

The input magnitude signal $|X_n|$ is received by a second plurality of J configurable delay lines 212-1 through 212-J. Each configurable delay line ($z^{-p_j}$) 212-$j$ (j=1 to J) in this second plurality may be electronically programmed to provide a delay of $p_j$ unit intervals. As depicted, the first configurable delay line 212-1 may be electronically programmed to provide a delay of $p_1$ unit intervals, . . . , and the Jth configurable delay line 212-J may be electronically programmed to provide a delay of $p_J$ unit intervals.

Each delayed input magnitude signal $|X_{n-p_j}|$ may be provided to a configurable look-up table (LUT) 214-$j$ (j=1 to J). Each LUT 214-$j$ uses coefficients 185 received from the adaption component 180 to generate the LUT output $C(p_j)$.

As depicted, the first LUT 214-1 generates the summation output $C(p_1)$, . . . , and the Jth LUT 214-J generates the LUT output $C(p_J)$.

As further shown in FIG. 2, the predistortion component 200 may include a plurality of signal multipliers 216-1 through 216-J. Each multiplier 216-$j$ (j=1 to J) receives the delayed input data signal $X_{n-m_j}$ from the corresponding configurable delay line 202-$j$ and the LUT output $C(p_j)$ from the corresponding LUT 214-$j$. These two signals are multiplied by the multiplier 216-$j$, and the resultant product is provided to the summation node 218.

The summation node 218 receives and adds together the products from the plurality of signal multipliers 216-1 through 216-J. The output Z(n) of the summation node 218 is the output of the predistortion component 110.

The exemplary structure 200 described above for the predistortion component 110 provides an advantageously flexible digital predistortion architecture. This architecture is flexible in that each LUT of a plurality of J LUTs may be configured by electronic programming to account for a specific term in a Volterra Series based model. The Volterra Series based model is described below in relation to FIG. 3.

A conventional digital predistortion architecture based on a Volterra Series typically provides circuitry or computing non-cross terms separately from circuitry for computing cross terms. However, as shown in Eq. (1) of FIG. 3, the present disclosure re-writes the Volterra Series to combine the non-cross terms with the cross terms (i.e. does not treat the non-cross and cross terms separately).

In Eq. (1), Q is the memory depth, and K is the non-linearity order. The delay of the input data signal $X_{n-m}$ is represented by m, and the summation over m is from 0 to Q. The delay in the input magnitude signal $|X_{n-p}|$ is represented by p, and the summation of p is also from 0 to Q. The order of the term $|X_{n-p}|^k$ is represented by k, and the summation of k is from 0 to K. The coefficients are represented by $\beta_{m,p,k}$. These coefficients $\beta_{m,p,k}$ depend on m, p, and k and may be provided by the adaption component 180.

The delayed input data signal $X_{n-m}$ does not depend on p or k, so Eq. (1) may be rewritten as Eq. (2) of FIG. 3. Finally, as shown in Eq. (3) of FIG. 3, the double summation over p and k may be implemented as look-up table that depends on Q and K and is represented by $C(|X_{n-p}|,Q,K)$. The input to the LUT is the input magnitude signal $|X_{n-p}|$, and the output of the LUT is $C(|X_{n-p}|,Q,K)$.

Note that the LUTs 214-$j$ (j=1 to J) in the structure 200 of FIG. 2 may be used to implement specific terms within the summation of Eq. (3), while other terms may be ignored (not computed). The specific terms to be implemented are configurable (programmable) by the user. This provides advantageous flexibility in tailoring the digital predistortion to efficiently and effectively suit the needs of a particular use.

Figure 4:
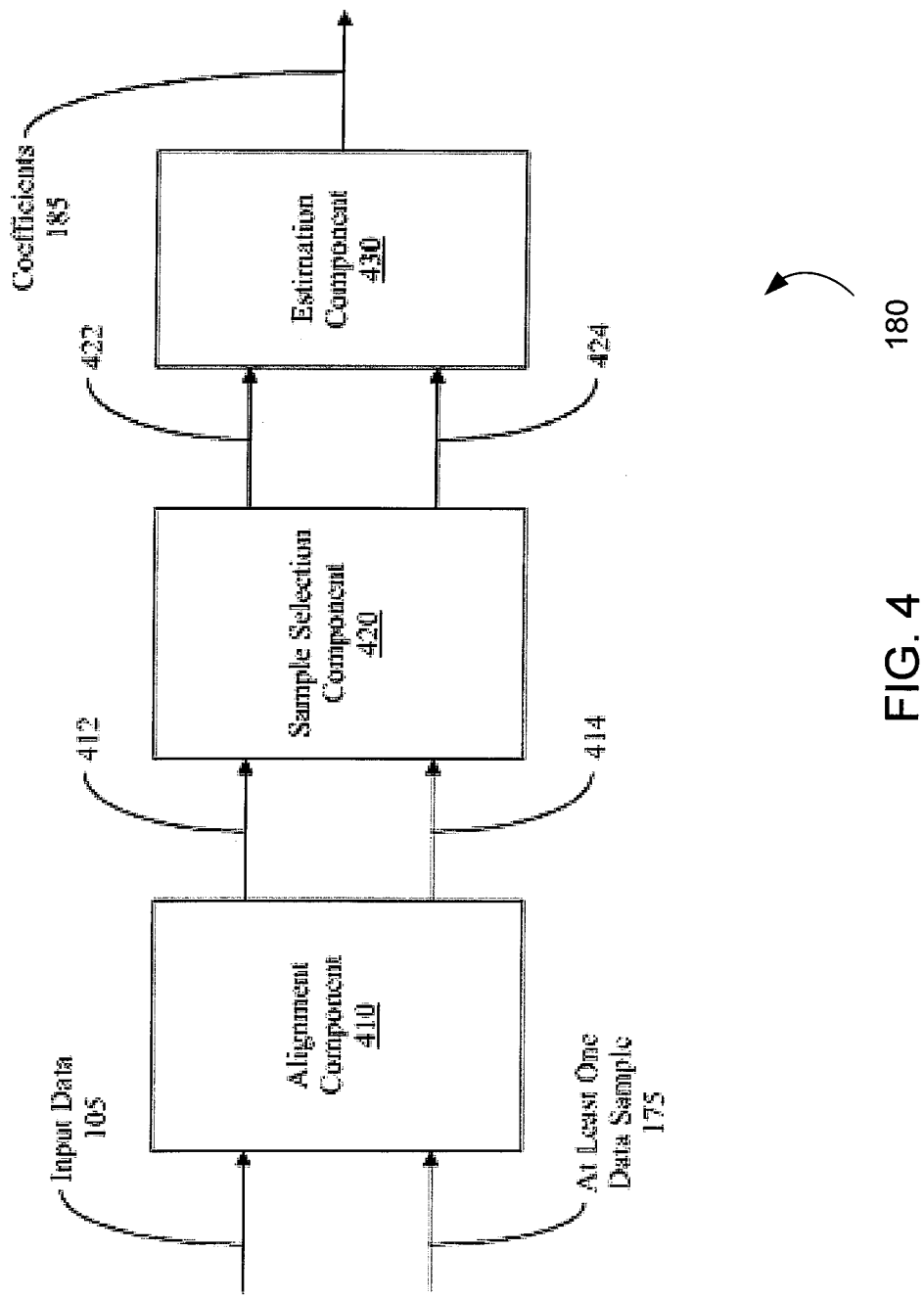
FIG. 4 depicts an exemplary structure for an adaption component in accordance with an embodiment of the invention.

An exemplary structure for an adaption component 180 is shown in FIG. 4. This structure includes an alignment component 410, a sample selection component 420, and an estimation component 430. The alignment component 410 may align the input data 105 and the at least one data sample 175 (which may be delayed with respect to the input data 105). The alignment component 410 outputs the aligned versions of the input data 412 and the at least one data sample 414 to the sample selection component 420. The sample selection component 420 selects one or more data samples based on one or more attributes of the data samples (e.g., such as magnitude, etc.). The selected data samples may be output as a signal 422 associated with input data 105 or as a signal 424 associated with the at least one data sample 175. Finally, the estimation component may access the selected samples and perform estimation based thereon to generate the coefficients 185. In one embodiment, the estimation may involve least squares estimation.

Figure 5:
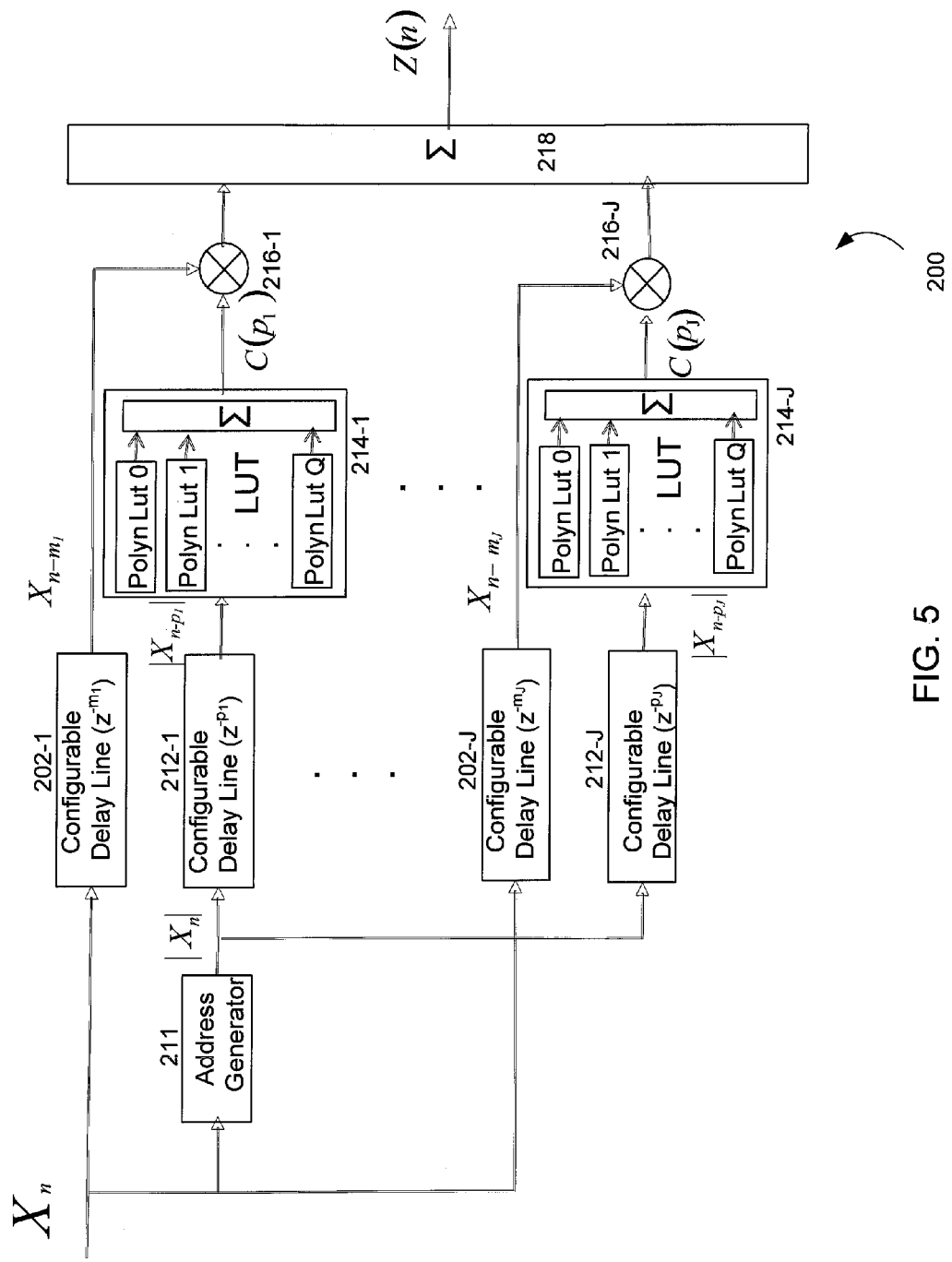
FIG. 5 depicts an exemplary structure for the look-up tables within the predistortion component in accordance with an embodiment of the invention.

FIG. 5 depicts an exemplary structure for the look-up tables (214-1, . . . , 214-J) within the predistortion component 200 in accordance with an embodiment of the invention. As shown, each LUT 214-*j* (j=1 to J) may be implemented using Q+1 polynomial LUTs (Polyn Lut 0, Polyn Lut 1, . . . , Polyn Lut Q), where Q is the memory depth. Each of these polynomial LUTs represents a term $$\sum_{k=0}^{K} \beta_{m,p,k} \cdot |X_{n-p}|^k$$

within Eq. (2), and the outputs of these polynomial LUTs are summed to generate the output $C(|X_{n-p}|,Q,K)$.

Figure 6:
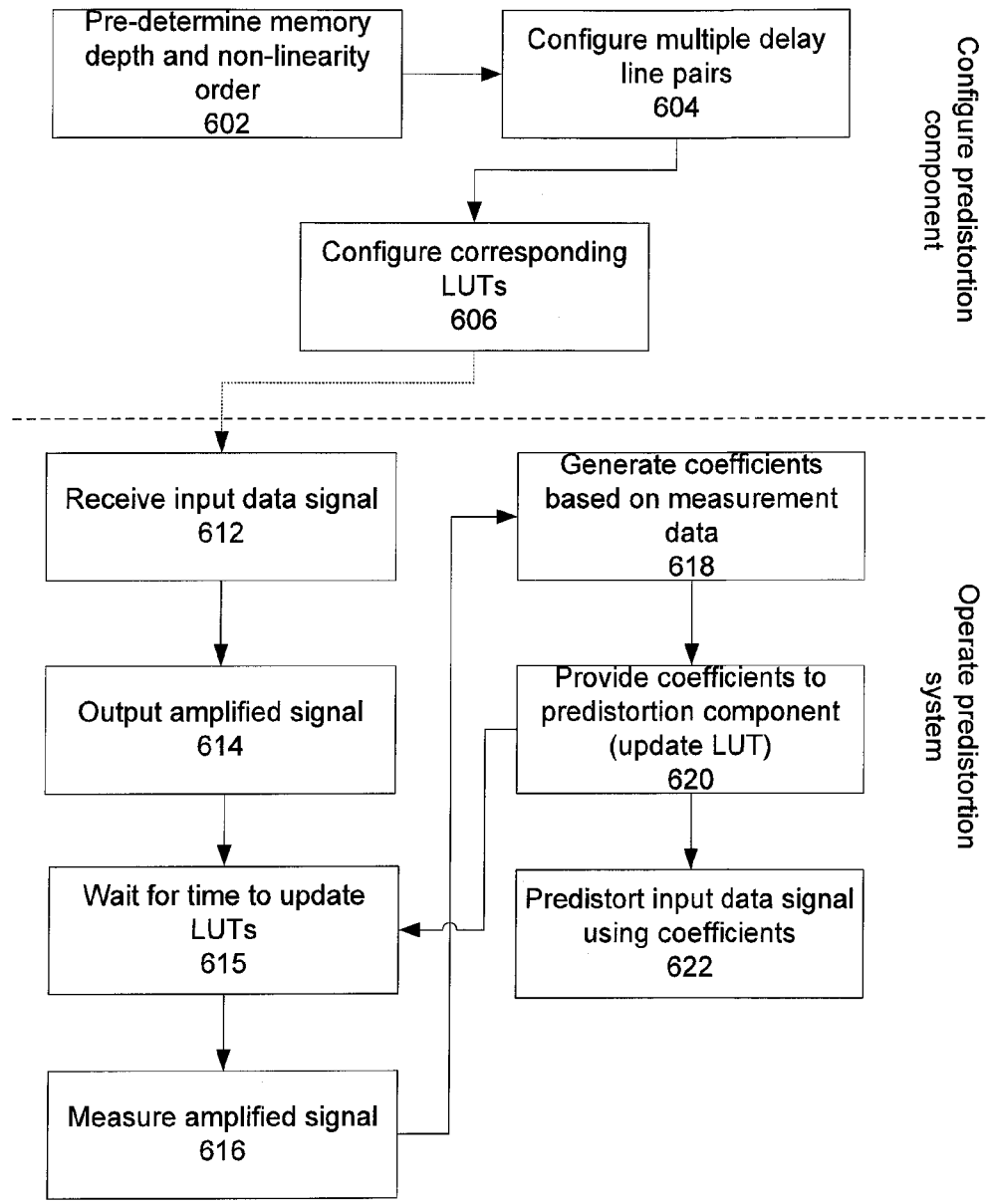
FIG. 6 is a flow chart of a method for configuring a predistortion component and performing digital predistortion on a regular basis in accordance with an embodiment of the invention.

FIG. 6 is a flow chart of a method 600 for configuring a predistortion component and performing digital predistortion on a regular basis in accordance with an embodiment of the invention. In an exemplary implementation, this method 600 may be performed using the system and circuits described above in relation to FIGS. 1-5.

Per block 602, a memory depth Q and a non-linearity order K may be pre-determined. This pre-determination may be made by a user or by a procedure based upon characteristics and constraints of the particular application for the digital predistortion system.

Per block 604, a plurality of delay line pairs are configured (for example, by electronic programming) to represent specific model terms. Each delay line pair includes a first delay line for delaying an input data signal and a second delay line for delaying a corresponding input magnitude signal. The model terms may be terms within a Volterra Series based model, for example.

Per block 606, for each delay line pair, an associated LUT is configured with computed values. The computed values for the LUT depend on the pre-determined memory depth Q and non-linearity order K.

The above-described blocks 602, 604 and 606 represent steps performed to configure or set-up the predistortion component for use within a digital predistortion system. The below-described blocks 612, 614, 616, 618, 620, and 622 represent steps performed during operation of the digital predistortion system.

Per blocks 612 and 614, an input data signal may be received, and an amplified signal may be output, respectively. Subsequently, per block 615, the method 600 may wait for a time to update the LUTs in the predistortion component. In one embodiment, the LUTs may be updated periodically according to a configurable period of time (for example, every 10 milliseconds).

Per block 616, the amplified signal may be measured, and, per block 618, the adaption component may compute or generate coefficients based on samples of an amplified signal. These coefficients are provided to the predistortion component per block 620.

Finally, per block 622, the predistortion component including the delay line pairs and their corresponding LUTs are utilized to predistort the input data. The predistortion performed depends dynamically on the coefficients generated by the adaption component.

The method 600 is iterative in that it loops back from block 620 to block 615. Per block 615, the method 600 waits until the next time to update the LUTs.

Exemplary FPGA and System

Figure 7:
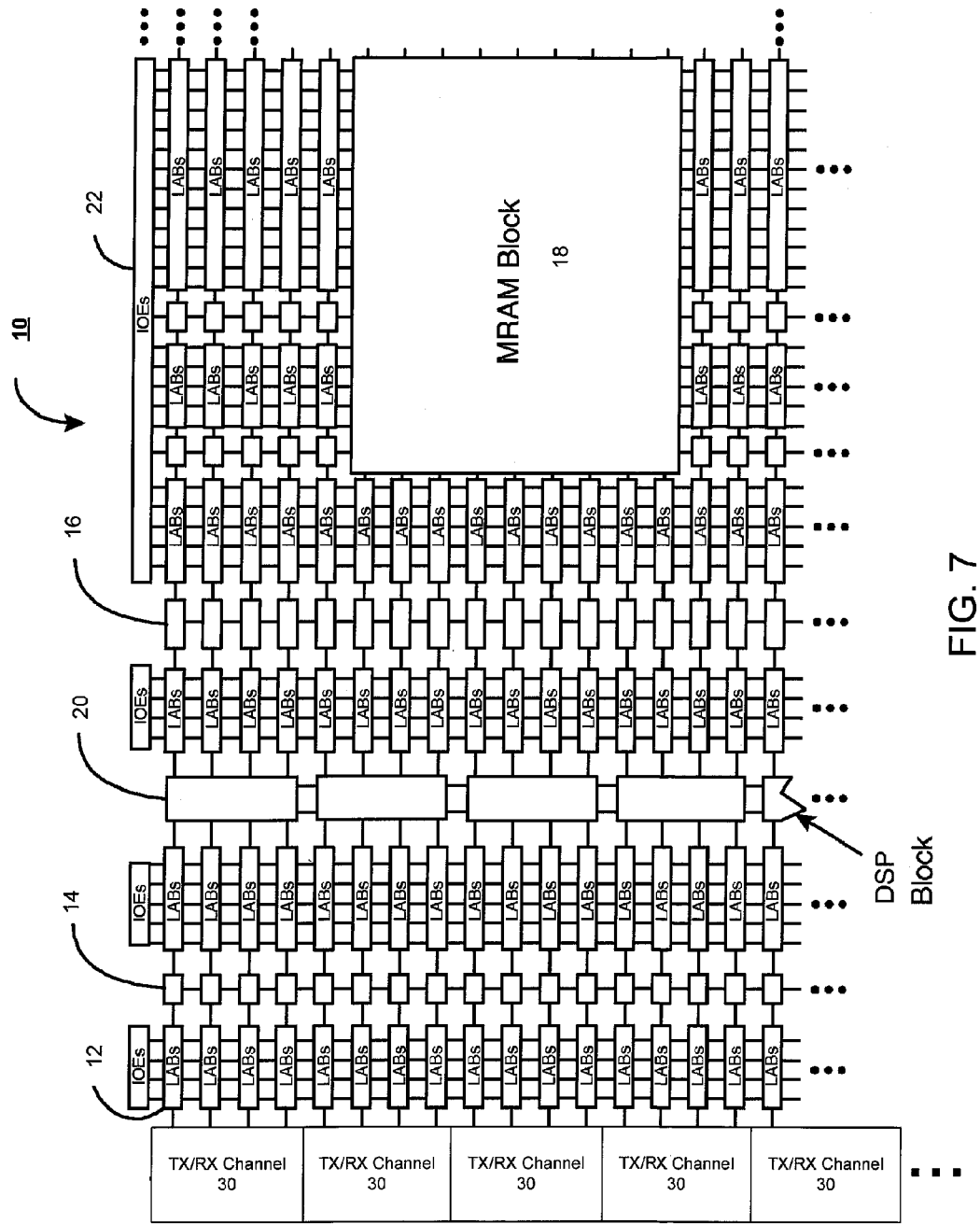
FIG. 7 is a simplified partial block diagram of an exemplary field programmable gate array (FPGA) that may be configured to employ structures and use techniques disclosed herein.

FIG. 7 is a simplified partial block diagram of an exemplary field programmable gate array (FPGA) 10 that may be configured to employ structures and use techniques disclosed herein. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs.

It is to be understood that FPGA 10 is described herein for illustrative purposes only and that the present invention can be implemented in many different types of PLDs, FPGAs, and ASICs.

Figure 8:
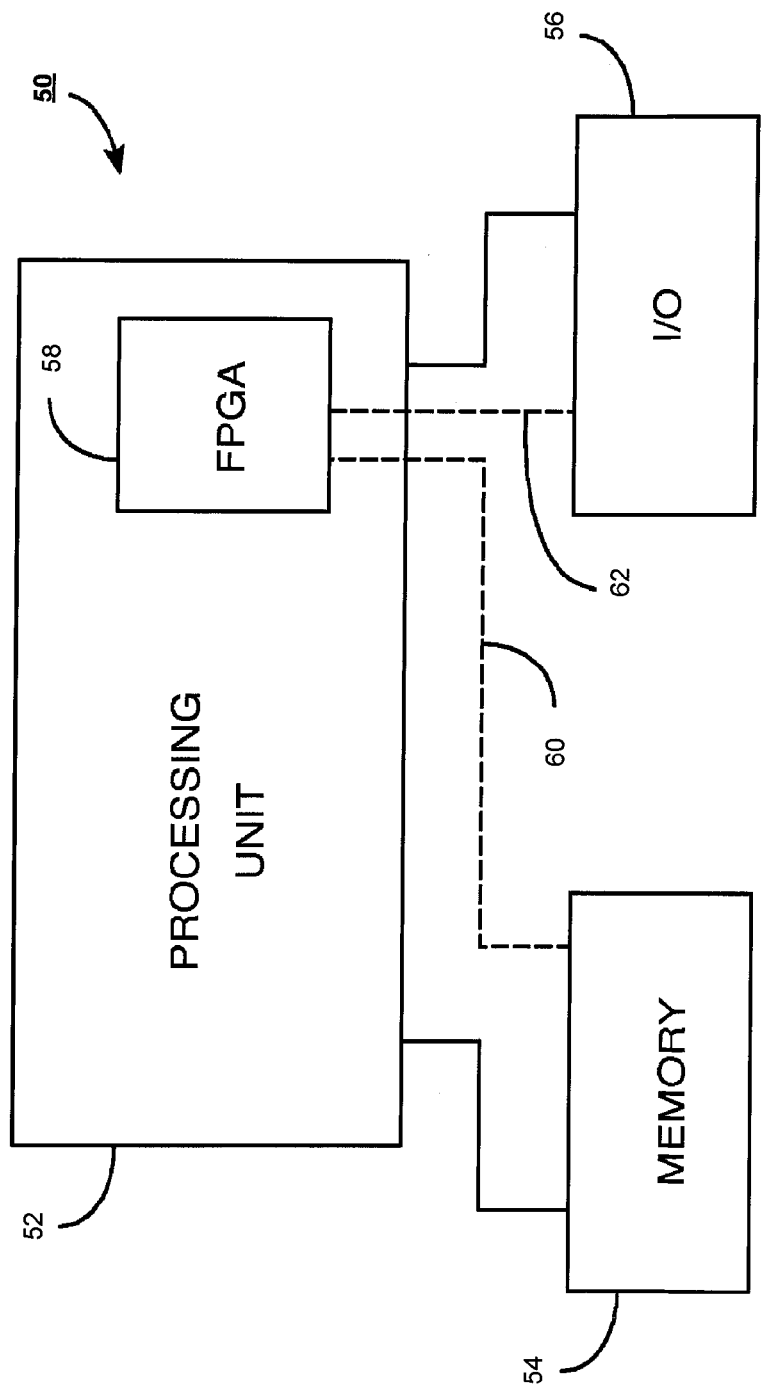
FIG. 8 shows a block diagram of an exemplary digital system that may include an FPGA.

FIG. 8 shows a block diagram of an exemplary digital system 50 that may include an FPGA. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

CONCLUSION

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A predistortion component circuit comprising:
    a plurality of configurable delay line pairs, wherein each said configurable delay line pair includes a first delay line for delaying an input data signal to provide a delayed input and a second delay line for delaying an input magnitude signal to provide a delayed input magnitude;
    a plurality of configurable look-up tables, wherein each said configurable look-up table receives the delayed input magnitude from, and outputs a look-up value for, an associated delay line pair of the plurality of configurable delay line pairs, and wherein each said configurable look-up table is configured with computed values that depend on a memory depth and a non-linearity order; and
    an address generator for receiving the input data signal and generating the input magnitude signal therefrom,
    wherein the second delay line in each said configurable delay line pair receives the input magnitude signal directly from the address generator.

2. The predistortion component circuit of claim 1, further comprising:
    a plurality of multiplier circuits, each multiplier circuit multiplying the look-up value from one said configurable look-up table with the delayed input from said associated delay line pair.

3. The predistortion component circuit of claim 2, further comprising:
    a summation node for adding together outputs from the plurality of multiplier circuits to generate an output of the predistortion component circuit.

4. The predistortion component circuit of claim 1, wherein each said configurable look-up table comprises:
    a plurality of polynomial look-up tables for receiving the delayed input magnitude from said associated delay line pair; and
    a sum node for adding together values output from the plurality of polynomial look-up tables.

5. A method for configuring a predistortion component in a digital predistortion system, the method comprising:
    pre-determining a memory depth and a non-linearity order;
    electronically programming a plurality of delay line pairs, wherein each said delay line pair includes a first delay line for delaying an input data signal so as to provide a delayed input and a second delay line for delaying an input magnitude signal so as to provide a delayed input magnitude;
    electronically programming a plurality of look-up tables associated with said plurality of delay line pairs, wherein each said look-up table is configured with computed values that depend on the memory depth and the non-linearity order;
    generating the input magnitude signal from the input data signal using an address generator; and
    receiving the input magnitude signal by the second delay line in each said delay line pair directly from the address generator.

6. The method of claim 5, wherein each said delay line pair corresponds a specific term in a Volterra Series model.

7. A system for digital predistortion, the system comprising:
    a predistortion component circuit for receiving an input data signal and outputting a predistorted input data signal;
    first conversion circuitry for converting the predistorted input data signal to a predistorted analog signal;
    an amplifier for amplifying the predistorted analog signal and outputting an amplified signal;
    a sampling component circuit for sampling the amplified signal to obtain a sampled analog signal;
    second conversion circuitry for converting the sampled analog signal to at least one data sample; and
    an adaption component circuit for receiving the at least one data sample and generating coefficients for use by the predistortion component circuit,
    wherein the predistortion component circuit includes an address generator, a plurality of configurable delay line pairs and a plurality of configurable look-up tables,
    wherein each said configurable delay line pair includes a first delay line for delaying an input data signal to provide a delayed input and a second delay line for delaying an input magnitude signal to provide a delayed input magnitude,
    wherein the address generator receives the input data signal and generates the input magnitude signal therefrom, and
    wherein the second delay line in each said configurable delay line pair receives the input magnitude signal directly from the address generator.

8. The system of claim 7, wherein each said configurable look-up table receives the delayed input magnitude from, and outputs a look-up value for, an associated delay line pair of the plurality of configurable delay line pairs.

9. The system of claim 8, wherein each said configurable look-up table is configured with computed values that depend on a memory depth and a non-linearity order.

10. The system of claim 7, wherein the predistortion component circuit further comprises:
- a plurality of multiplier circuits, each multiplier circuit multiplying the look-up value from one said configurable look-up table with the delayed input from said associated delay line pair.

11. The system of claim 10, wherein the predistortion component circuit further comprises:
- a summation node for adding together outputs from the plurality of multiplier circuits to generate an output of the predistortion component circuit.

12. The system of claim 7, wherein each said configurable look-up table comprises:
- a plurality of polynomial look-up tables for receiving the delayed input magnitude from said associated delay line pair; and
- a sum node for adding together values output from the plurality of polynomial look-up tables.

* * * * *